(12) United States Patent
Grebs et al.

(10) Patent No.: US 8,039,897 B2
(45) Date of Patent: Oct. 18, 2011

(54) LATERAL MOSFET WITH SUBSTRATE DRAIN CONNECTION

(75) Inventors: Thomas E. Grebs, Mountain Top, PA (US); Gary M. Dolny, Mountain Top, PA (US); Daniel M. Kinzer, El Segundo, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 168 days.

(21) Appl. No.: 12/339,215

(22) Filed: Dec. 19, 2008

(65) Prior Publication Data

US 2010/0155839 A1 Jun. 24, 2010

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ......... 257/336; 257/328; 257/341; 257/401

(58) Field of Classification Search .................. 257/336, 257/335, 337, 338, 339, 340, 341, 342, 343, 257/409, 332, 492, 384, 328, 331, 334, 141, 257/122, 146, 162
See application file for complete search history.

(56) References Cited

U.S. PATENT DOCUMENTS 6,600,182 B2 7/2003 Rumennik
7,282,765 B2 * 10/2007 Xu et al. ...................... 257/343
2002/0185705 A1 12/2002 Saitoh et al.
2003/0089947 A1 * 5/2003 Kawaguchi et al. .......... 257/341
2003/0201456 A1 10/2003 Saitoh et al.
2006/0118832 A1 6/2006 Visser et al.
2007/0114608 A1 5/2007 Letavic

OTHER PUBLICATIONS

J.C.W. Ng, J.K.O. Sin and L. Guan, "A Novel Planar Power MOSFET With Laterally Uniform Body and Ion-Implanted JFET Region", Electron Device Letters, IEEE, Apr. 2008, vol. 29, Issue: 4, pp. 375-377, ISSN 0741-3106, current version published Mar. 21, 2008.
International Search Report with Written Opinion in corresponding PCT Application (PCT/US2009/067151), completed Jun. 23, 2010, total 7 pages.

* cited by examiner

*Primary Examiner* — Chuong A. Luu
(74) *Attorney, Agent, or Firm* — Thomas R. FitzGerald, Esq.; Hiscock & Barclay, LLP

(57) ABSTRACT

In one form a lateral MOSFET includes an active gate positioned laterally between a source region and a drain region, the drain region extending from an upper surface of a monocrystalline semiconductor body to a bottom surface of the monocrystalline semiconductor body, and a non-active gate positioned above the drain region. In another form the lateral MOSFET includes a gate positioned laterally between a source region and a drain region, the drain region extending from an upper surface of a monocrystalline semiconductor body to a bottom surface of the monocrystalline semiconductor body, the source region and the drain region being of a first conductivity type, a heavy body region of a second conductivity type in contact with and below the source region, and the drain region comprising a lightly doped drain (LDD) region proximate an edge of the gate and a sinker extending from the upper surface of the monocrystalline body to the bottom surface of the monocrystalline semiconductor body.

21 Claims, 18 Drawing Sheets

LATERAL MOSFET WITH SUBSTRATE DRAIN CONNECTION

CROSS REFERENCE TO A RELATED APPLICATION

Reference is made to a related application Ser. No. 12/352,057 entitled "Lateral Drain MOSFET With Improved Clamping Voltage Control" which is incorporated herein in its entirety by reference.

FIELD OF THE INVENTION

This invention relates to lateral MOSFETs with a substrate drain connection, and more particularly to lateral MOSFETs with a substrate drain connection wherein the drain has a lateral segment and a vertical segment.

BACKGROUND OF THE INVENTION

There exists a number of U.S. patents directed to lateral MOSFETs with a substrate drain connection including U.S. Pat. No. 6,600,182 issued to Rumennik on Jul. 29, 2003, and U.S. Pat. No. 7,282,765 issued to Xu et al. on Oct. 16, 2007, both of which make reference to additional patents related to lateral MOSFETs with a substrate drain connection. Also, Ng, Jacky C. W., A Novel Planar Power MOSFET With Laterally Uniform Body and Ion-Implanted JFET Region, IEEE Electron Device Letters, Vol. 29, No. 4, April 2008, pp. 375-377, describes a lateral MOSFET with a substrate drain connection. For these devices which are designed for use in high frequency power applications, a number of transistor characteristics, such as gate-to-drain capacitance and Rdson, are important and therefore affect the sales of such devices.

SUMMARY OF THE INVENTION

The invention comprises, in one form thereof, a lateral MOSFET comprising a heavily doped substrate of a first conductivity type with a first epitaxial layer of the first conductivity type laying over the substrate. The lateral MOSFET includes a diffused tub of a second conductivity type opposite to the first conductivity type formed in the first epitaxial layer, an active gate electrode on a gate dielectric which is on a major surface of the first epitaxial layer, and a source region of the first conductivity type in the first epitaxial layer extending to the major surface of the first epitaxial layer and self aligned with a first edge of the active gate electrode. Also included is a lightly doped drain of the first conductivity type in the first epitaxial layer extending to the major surface of the first epitaxial layer and self aligned with a second edge of the active gate electrode on an opposite side of the active gate electrode from the first edge, and a sinker region of the first conductivity type on the same side of the active gate electrode as the lightly doped drain and spaced apart from the active gate electrode, the sinker region extending from the major surface of the first epitaxial layer to a depth substantially equal to the depth of the first epitaxial layer.

In a further aspect of the present invention the lateral MOSFET comprises a second epitaxial layer of the first conductivity type between the substrate and the first epitaxial layer.

In a still further aspect of the present invention the lateral MOSFET comprises a non-active gate attached to the major surface of the first epitaxial layer, the non-active gate on the same side of the active gate electrode as the lightly dope diffusion and spaced apart from the active gate electrode, and substantially between the lightly doped diffusion and the portion of the sinker in the major surface of the first epitaxial layer.

In yet another aspect of the present invention the diffused tub has a dopant profile of a diffused region such that the dopant profile of the diffused tub decreases from the major surface of the first epitaxial layer downward.

In an additional aspect of the present invention the diffused tub has a dopant profile of a region formed by multiple implants such that the vertical dopant profile of the diffused tub is substantially uniform.

In still another aspect of the present invention the lateral MOSFET includes a heavily doped region of the second conductivity type laying substantially below the source region.

In yet another aspect of the present invention the sinker has a vertical dopant profile which decreases from the major surface of the first epitaxial layer downward.

In an alternative aspect of the present invention the sinker has a vertical dopant profile which is substantially uniform.

In still another alternative aspect of the present invention the sinker has a vertical dopant profile which increases from the major surface of the first epitaxial layer downward.

The invention comprises, in one form thereof a lateral MOSFET comprising an active gate positioned laterally between a source region and a drain region, the drain region extending from an upper surface of a monocrystalline semiconductor body to a bottom surface of the monocrystalline semiconductor body, and a non-active gate positioned above the drain region.

The invention comprises, in another form thereof, a lateral MOSFET comprising a gate positioned laterally between a source region and a drain region, the drain region extending from an upper surface of a monocrystalline semiconductor body to a bottom surface of the monocrystalline semiconductor body, the source region and the drain region being of a first conductivity type, a heavy body region of a second conductivity type in contact with and below the source region, metallization extending below the upper surface of the monocrystalline body in contact with the source region and the heavy body along a lateral surface and a side surface of each of the source region and the heavy body, and the drain region comprising a lightly doped drain (LDD) region proximate an edge of the gate and a sinker extending from the upper surface of the monocrystalline body to the bottom surface of the monocrystalline semiconductor body.

In yet another form, the invention includes a method for forming a lateral MOSFET with a substrate drain connection. The method comprises the steps of forming a source region and a drain region in an upper surface of a monolithic semiconductor body, and an active gate positioned above the monocrystalline semiconductor body between the source region and the drain region, the drain region extending from an upper surface of the monocrystalline semiconductor body to a bottom surface of the monocrystalline semiconductor body, and forming a non-active gate positioned above the drain region.

In still another form, the invention includes a method for forming a lateral MOSFET with a substrate drain connection. The method comprises the steps of forming a source region and a drain region in an upper surface of a monolithic semiconductor body, and an gate positioned above the monocrystalline semiconductor body between the source region and the drain region, the drain region extending from an upper surface of the monocrystalline semiconductor body to a bottom surface of the monocrystalline semiconductor body, and forming a heavy body region of a second conductivity type in contact with and below the source region, wherein the step of forming the drain region includes the step of forming a lightly doped drain (LDD) region proximate an edge of the gate, and a sinker extending from the upper surface of the monocrystalline body to the bottom surface of the monocrystalline semiconductor body.

BRIEF DESCRIPTION OF THE DRAWINGS

The aforementioned and other features, characteristics, advantages, and the invention in general will be better understood from the following more detailed description taken in conjunction with the accompanying drawings, in which.

Figure 1A:
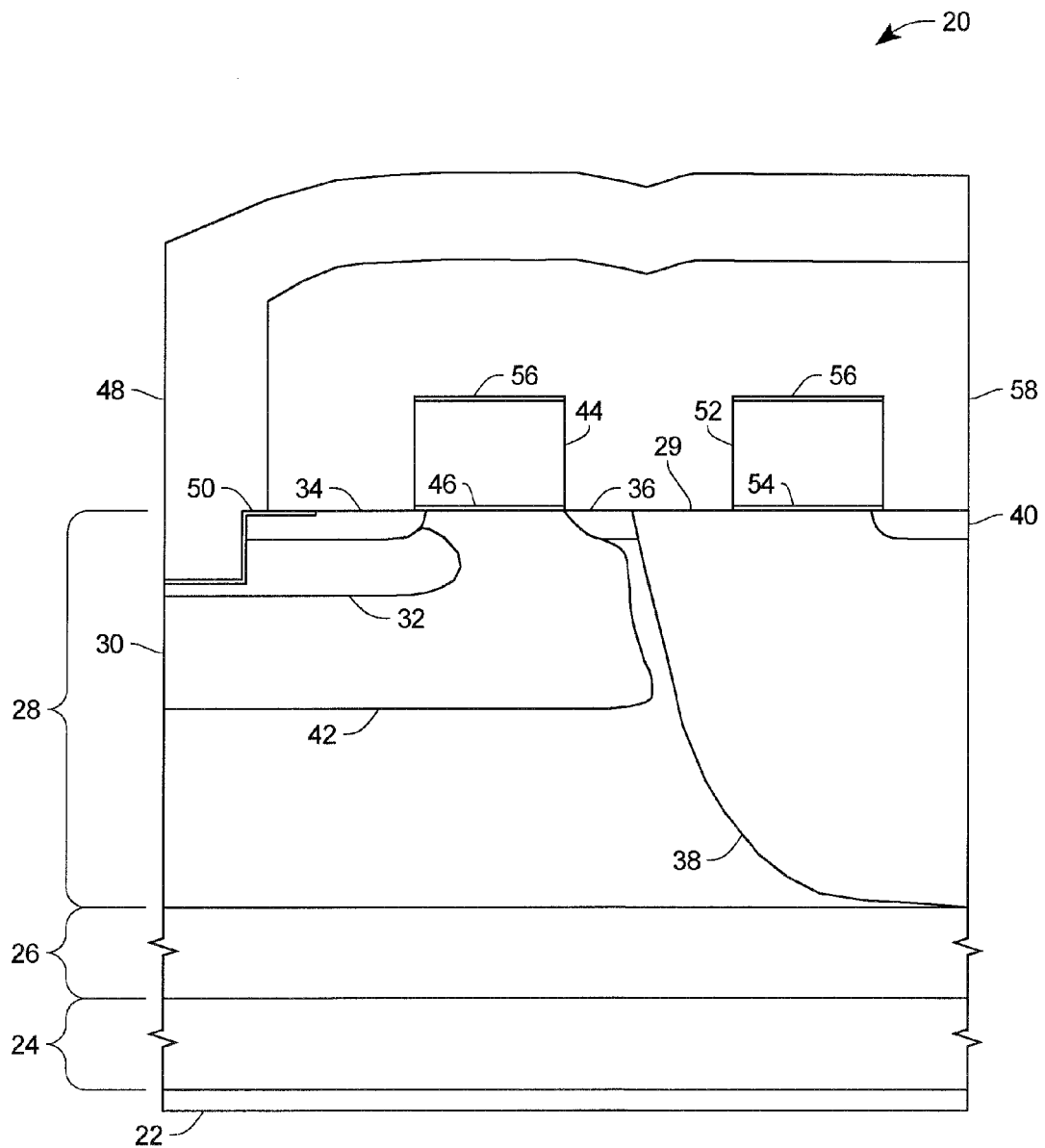
FIG. 1A is a side diagrammatical view of an embodiment of a lateral MOSFET with a substrate drain connection according to the present invention.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

Turning now to the drawings, FIG. 1A is a side diagrammatical view of an embodiment of a lateral MOSFET 20 according to the present invention. The lateral MOSFET 20 includes a substrate drain connection 22, which may be a metallization, a heavily doped substrate 24 of a first conductivity type which has grown thereon an optional heavily doped first epitaxial layer 26 of the first conductivity type, and a second epitaxial layer 28 having a top or major surface 29. The substrate 24 and the second epitaxial layer 28 with or without the optional heavily doped first epitaxial layer 26 form a monocrystalline semiconductor body. Although the first conductivity type can be N type or P type, for ease of discussion the first conductivity type will hereinafter be referred to as N type, and a second conductivity type, opposite to the first conductivity type, will therefore be referred to hereinafter as P type. As described in more detail below, the second epitaxial layer 28 is initially N type that is more lightly doped than the substrate 24 or the optional first epitaxial layer 26, and contains a P well 30, a heavy P body 32, a heavily doped N-type source region 34 which extends to the upper surface of the second epitaxial layer 28, an LDD region 36, a sinker 38, and an optional heavily doped N region 40 formed in the sinker 38 which extends to the upper surface of the second epitaxial layer 28. The line 42 indicates the PN junction between the P well 30 and the N-type second epitaxial layer 28 and the LDD region 36.

Figure 7:
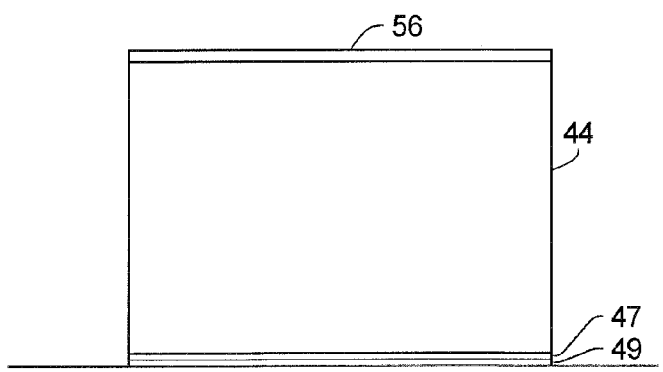
FIG. 7 shows an alternative embodiment of a gate dielectric structure shown in FIG. 1.

An active gate electrode 44 is above the second epitaxial layer 28 and is separated from the second epitaxial layer 28 by a gate oxide 46. The gate oxide can be thermally grown, deposited or be of another dielectric material which can have a high dielectric constant (K) or a low dielectric constant, or a combination of dielectrics. FIG. 7 shows the active gate 44 with two dielectric layers 47 and 49 in place of the gate oxide 46, where dielectric layer 47 may be nitride and dielectric layer 49 may be a grown oxide. A portion of the P well 30 forms the channel region of the active gate electrode 44 with the source region 34 and the LDD region 36 extending for a short distance under the active gate electrode 44. The heavy P body 32 lies under the source region 34 and extends laterally further under the active gate electrode 44 in the embodiment shown if FIG. 1A. The P well 30 extends down from the gate oxide 46 and under the heavy P body 32.

Metallization 48 extends down into, and contacts, the heavy P body 32 and the source region 34 through a silicide layer 50.

A second non-active gate electrode 52 lies over the sinker 38 with a gate oxide 54 lying between the top of the second epitaxial layer 28 and the non-active gate electrode 52. Both the active gate electrode 44 and the non-active gate electrode 52 may be polysilicon with silicide layers 56 on the top surfaces of the two gate electrodes 44, 52. An interlevel dielectric 58 separates the metallization 48 from the gate electrodes 44, 52 and the top surface of the second epitaxial layer 28.

Figure 1B:
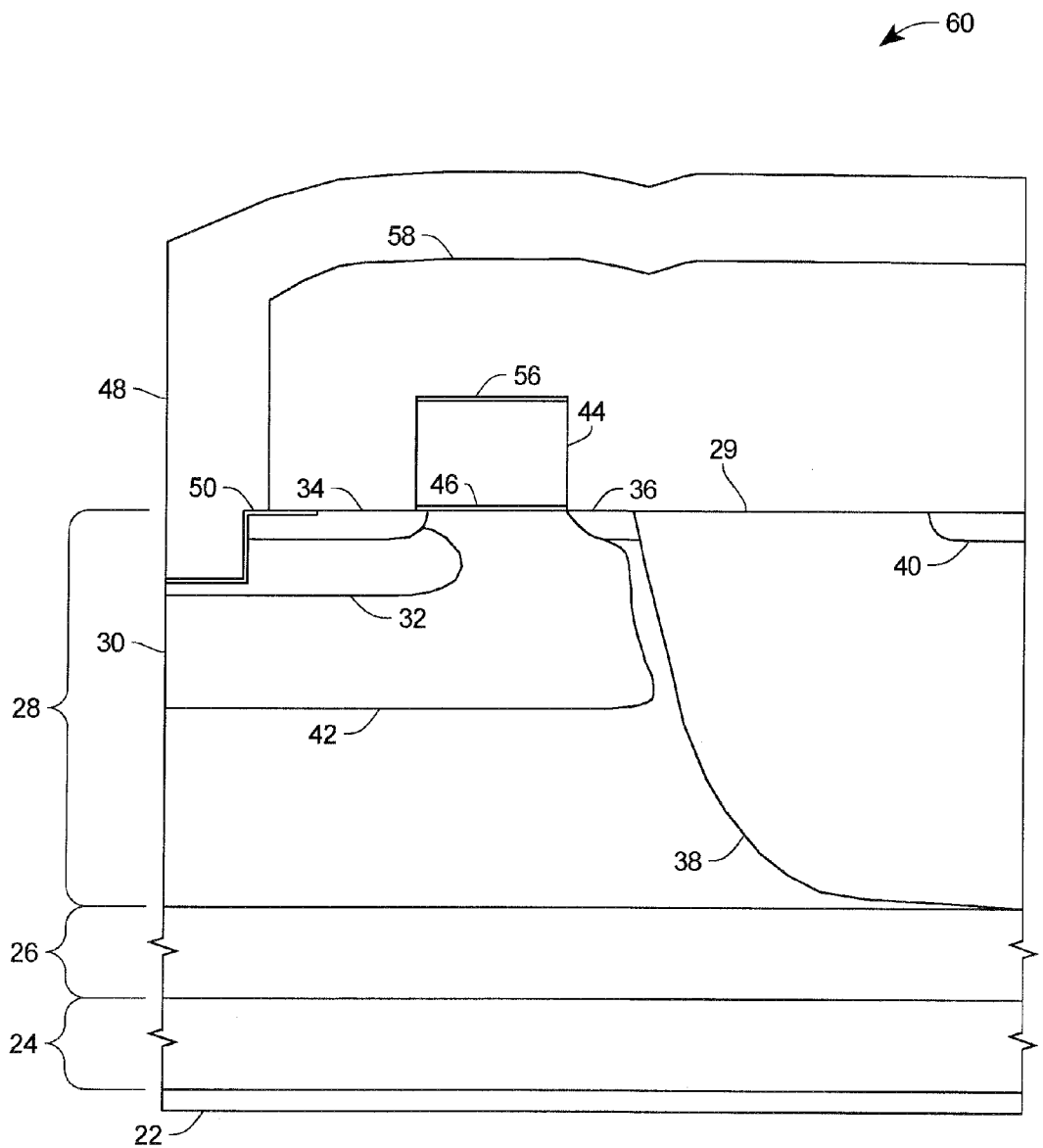
FIG. 1B is a side diagrammatical view of another embodiment of a lateral MOSFET with a substrate drain connection according to the present invention.

The lateral extent of the sinker 38 with respect to the active gate electrode 44 affects the Rdson and the breakdown voltage of the MOSFET 20. Although a lateral MOSFET according to the present invention does not have to have the non-active gate 52 as shown in FIG. 1B, the non-active gate electrode 52, which is formed with the same mask layer as the active gate electrode 44, provides more precise positioning of the sinker 38 with respect to the active gate electrode 44 than without the non-active gate electrode 52. The non-active gate electrode 52 is used as a portion of the mask for the sinker 36 implant, and thus the distance from the edge of the exposed region of the major surface 29 which will be implanted to form the sinker 38 to the edge of the active gate electrode 44 is set by a single mask. Without the non-active gate electrode 52, the distance from the exposed region of the major surface 29, which will be implanted to form the sinker 38, to the active gate electrode 44 is subject to the variation in alignment of two separate masks, and the width of the lateral MOSFET 60 shown in FIG. 1B may be wider than the width of the lateral MOSFET 20 shown in FIG. 1A to compensate for the mask alignment tolerance. For example, the width of the lateral MOSFET 20 of FIG. 1A may be 4 µm while the width of the lateral MOSFET 60 of FIG. 1B may be 5 µm.

Figure 2A:
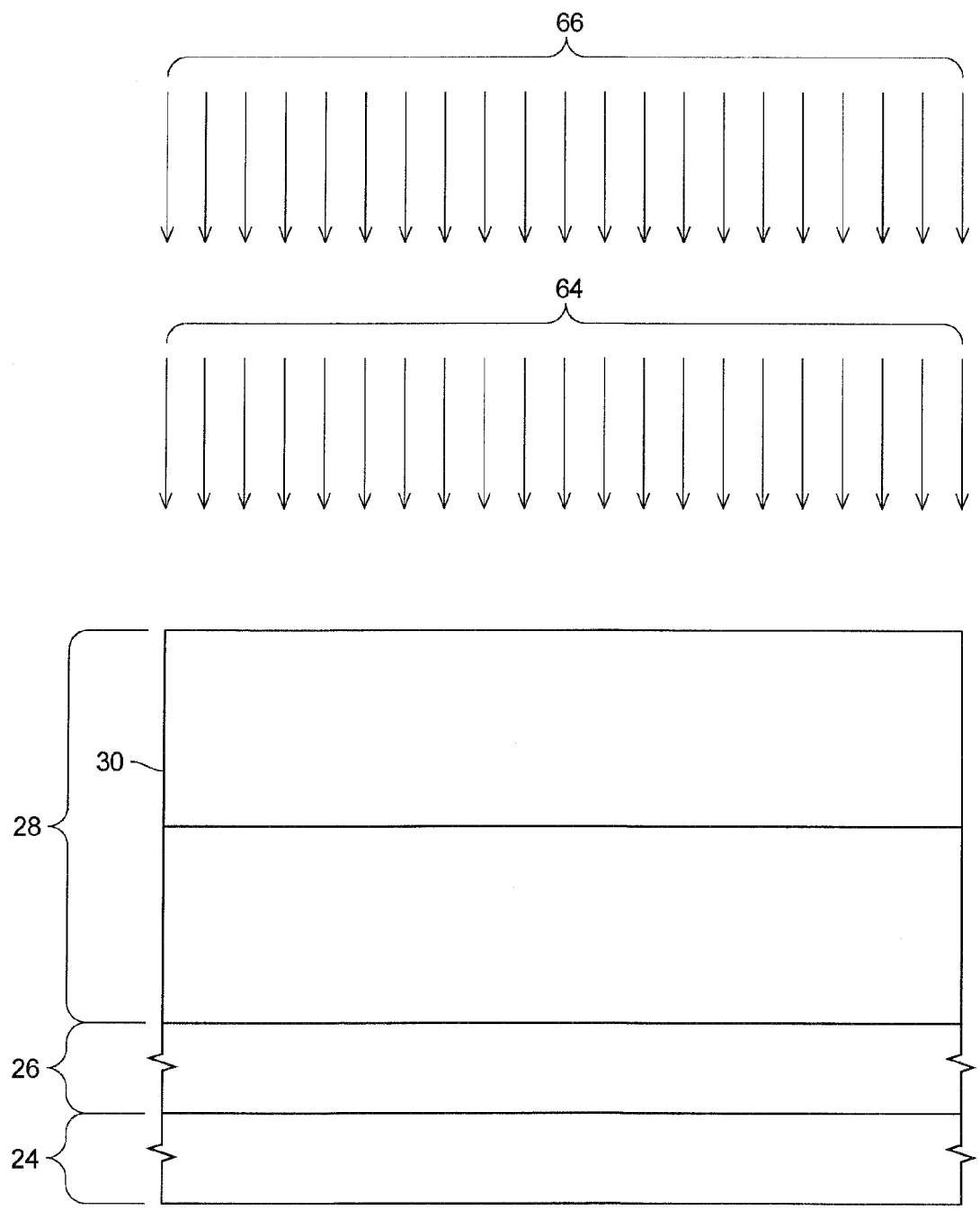
FIGS. 2A, 2B, 2C, 2D, 2E, 2F, and 2G are side diagrammatical views of the lateral MOSFET shown in FIG. 1A at selected processing stages in forming the lateral MOSFET of FIG. 1A.
Figure 2B:
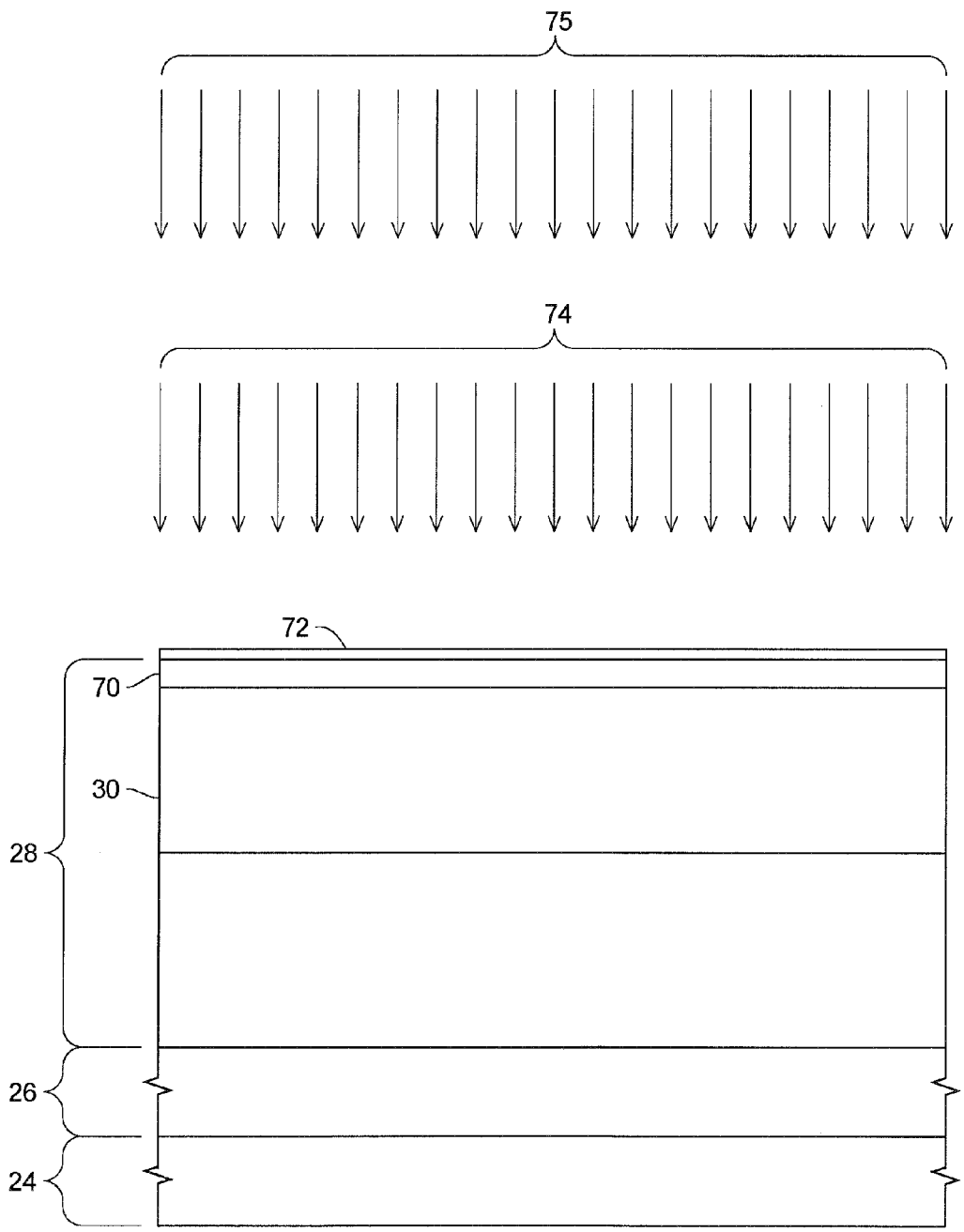
Figure 2C:
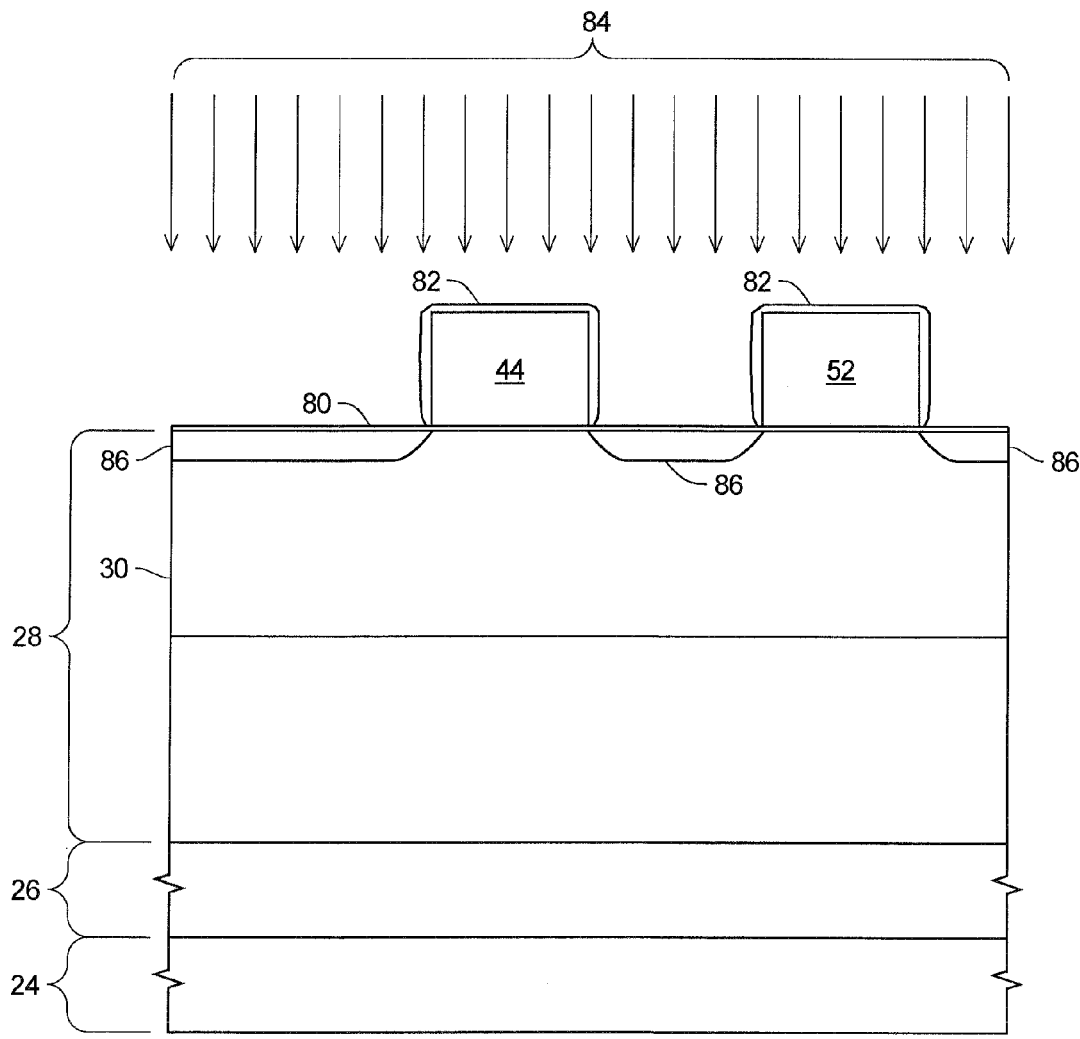
Figure 2D:
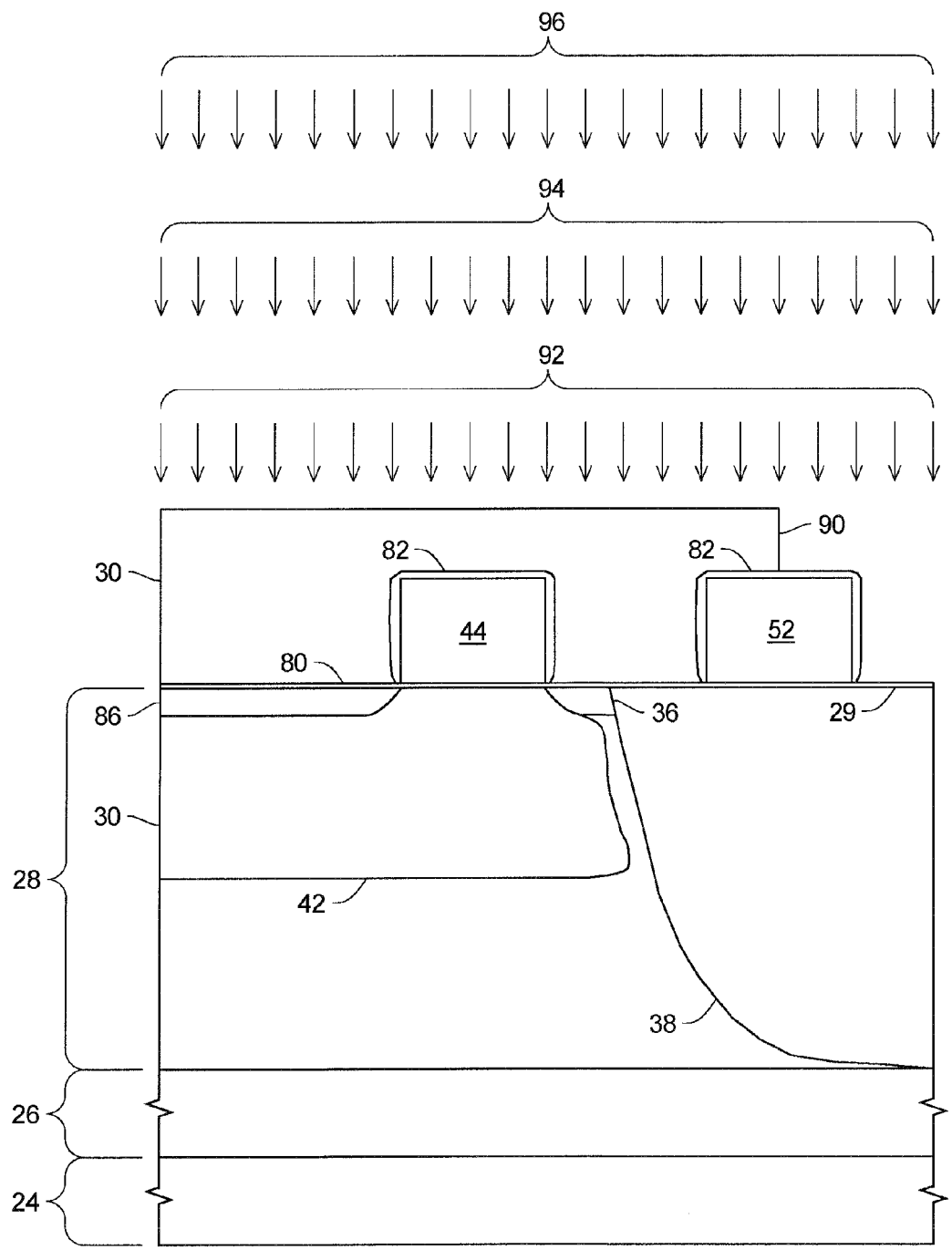

Those skilled in the art will understand that the non-active gate electrode 52, while formed with the same etch mask used to form the active gate electrode 44, only has to be wide enough to compensate for the mask variations in the photoresist mask used to pattern the photoresist shown in FIG. 2D. Thus it may be possible that the non-active gate electrode 52 may be of a different material than the active gate electrode 44, and may have a shape different from the active gate electrode 44.

FIGS. 2A-2G are side diagrammatical views of the lateral MOSFET 20 at selected processing stages in one embodiment for forming the lateral MOSFET 20. In FIG. 2A, the substrate 24 is N+ and may be arsenic or phosphorous, and if phosphorous, may be red phosphorous with a conductivity, p, in the range of 0.5 to 2.5 mΩ·cm. If the substrate is phosphorous, the optional first epitaxial layer 26 may be arsenic doped to provide a buffer region between the heavily doped phosphorous substrate 24 into the second epitaxial layer 28 to isolate the diffusion from the heavily doped phosphorous substrate 24 and the second epitaxial layer 28. If an arsenic substrate 24 is used, the first arsenic epitaxial layer 26 may not be used. The arsenic first epitaxial layer 26 may have a p of about 8 mΩ·cm to provide an adequate conductivity path from the second epitaxial layer 28 to the substrate 24 and may have a thickness range of 0 to 4 µm depending on the extent of the diffusion from the substrate 24 which, in turn, depends on the thermal cycles during manufacture of the lateral MOSFET 20. Thus the first epitaxial layer 26 is used to maintain the desired dopant concentration in the second epitaxial layer 28 which affects the breakdown voltage of the lateral MOSFET 20.

The second epitaxial layer 28 may be a N-type layer with phosphorous doping, preferably with a ρ of about 2 Ω·cm.

Formed in the upper portion of the second epitaxial layer 28 is a P well 30 which may be formed by gaseous diffusion, by a single implant, or by multiple implants. A typical CMOS tub may be created if the P well 30 is formed by gaseous diffusion. A single implantation, as indicated by arrows 64, may be a boron implant at a nominal dose of 7e13@60 KeV. Multiple implants, as indicated by arrows 64 and 66, may include retrograde implants which may be at about 40 KeV and about 120 KeV, respectively.

The single and multiple implantations used to form the P well 30 have the advantage over gaseous diffusion of forming a more uniform vertical doping profile which may provide more consistency in the threshold voltages, Rdsons, and Qgds of multiple wafers of the lateral MOSFETs 20. If such consistency is present, the Rdson likely can be reduced while maintaining an acceptable Qgds compared to a diffused P well 30. The P well 30 is not formed in LOCOS regions or in termination regions of the semiconductor die.

FIG. 2B includes a threshold voltage, Vth, adjustment implant process which may or may not be necessary depending on the doping concentration at an upper region 70 of the P well 30. Shown in FIG. 2B is a sacrificial oxide layer 72 formed on the second epitaxial layer 28 prior to the threshold voltage adjust implantation, indicated by the arrows 74, to adjust the threshold voltage of the lateral MOSFET 20. Also shown in FIG. 2B is another possible implantation 75 of germanium to form a SiGe strained silicon channel region to improve hole and electron mobility. Other techniques which are know to those skilled in the art can be used to form the strained channel region.

FIG. 2C shows the structure shown in FIG. 2A after a gate oxide 80, which may be about 125 Å thick, depending on the desired electrical characteristics of the device, and may have a range of 50 to 400 Å, has been formed on the second epitaxial layer 28, and polysilicon has been deposited and patterned to form the active gate electrode 44 and the non-active gate electrode 52. The active gate electrode 44 may alternatively be a refractory metal. Seal oxides 82, which may be a little thicker than the gate oxide 80, have been formed around the gate electrodes 44, 52. The seal oxides 82 are optional and, if used, the thickness is dependent upon subsequent implantation energies. Implantation of the N type dopants, indicated by arrows 84, form LDD regions 86. The LDD regions 86 may be arsenic doped with an implantation dose selected from the range of 1e11 to 1e12 based at least in part on the subsequent thermal cycles that the lateral MOSFET device 20 is subjected to and also by a tradeoff between the Rdson and Qgd of the lateral MOSFET device 20. Although the LDD regions are formed everywhere in the active regions not masked by the gate electrodes 44, 52 and the seal oxides 82, only the LDD region 36 (shown in FIG. 1) does not receive heavier concentrations of dopants in later processing.

FIG. 2D shows a photoresist layer 90 used to form the sinker 38. The sinker 38 may be formed using up to three implants as indicated by the three sets of arrows 92, 94, and 96 in one or more embodiments of the present invention. For example a single implant of phosphorous at a dose of about 5e15@160 KeV may be used, two implants, one of arsenic at about 2e15@40 KeV and a second of phosphorous at about 3e16@160 KeV may be used, or three or more implants may be used with dopants, dosages, and implant voltages selected for a desired vertical dopant profile by those skilled in the art. The use of the non-active gate 52, the seal oxide 82 and the photoresist 90 allows relatively high implantation energies to form a uniform drain sinker 38 which has a relatively lower drain resistance than a drain sinker 38 with a vertical dopant gradient such as formed by gaseous diffusion. With multiple implants the vertical dopant profile of the sinker 38 may also increase from the major surface 29 to the lower region of the second epitaxial layer 28. Multiple implants allow the drain sinker 38 to be deeper with less lateral width compared to a single implant and subsequent diffusion since pushing a single implant deeper causes more lateral spread of the final sinker 38 and an increase in the resistivity of the sinker 38.

Figure 2E:
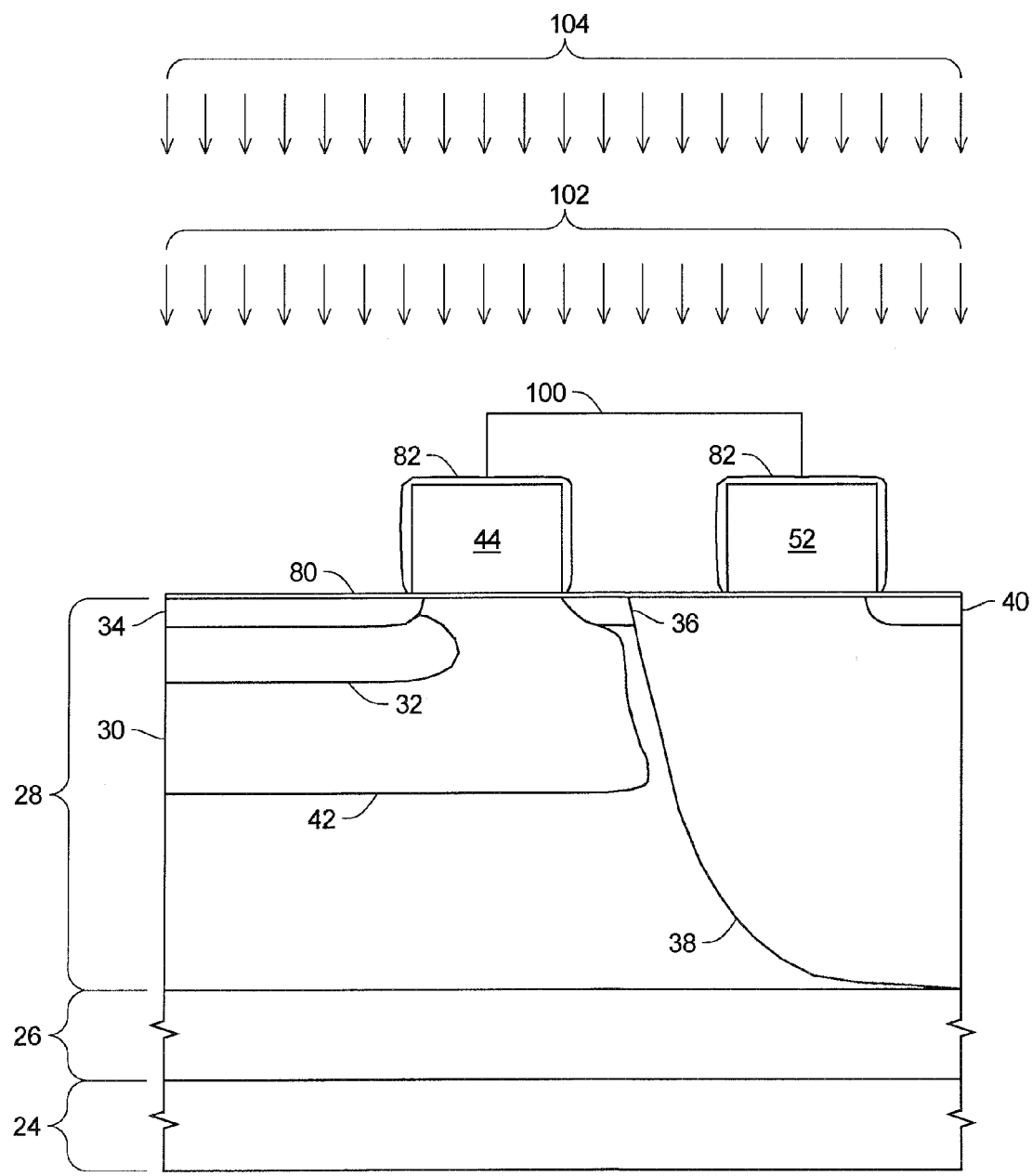

FIG. 2E shows process steps which may be used for forming the heavy P body 32, the source region 34, and the optional heavily doped N region 40. A photoresist layer 100 fills the gap between the gate electrodes 44, 52. The heavy P body 32, the N type source region 34, and the optional heavily doped N region 40 may be formed by the implantation of P-type dopants indicated by the arrows 102, and N-type dopants indicated by the arrows 104. If the optional heavily doped N region 40 is not desired, the photoresist layer 100 would be extended to the right edge of the second epitaxial layer 28.

The heavy P body 32 may be implanted with boron at a dose of about 2.5e14@60 KeV. The concentration of the heavy P body 32 is determined by several factors, including the desired unclamped inductive switching (UIS) capability, the impact on the threshold voltage, the breakdown voltage, the Rdson, and the metallization used as Ti will leach boron out of the heavy P body 32. The source region 43 may be implanted with arsenic at a dose of about 5e15@160 KeV. With the photoresist mask 100 the sinker 35 will also receive the boron implant, but the heavier concentration of sinker N type dopants will dominate the boron implanted dopants. Alternatively, the region at the surface of the second epitaxial layer 28 can be masked during the boron implant. After subsequent thermal treatment of the device shown in FIG. 2E, the source region may have a depth of 0.25 µm or less.

Figure 2F:
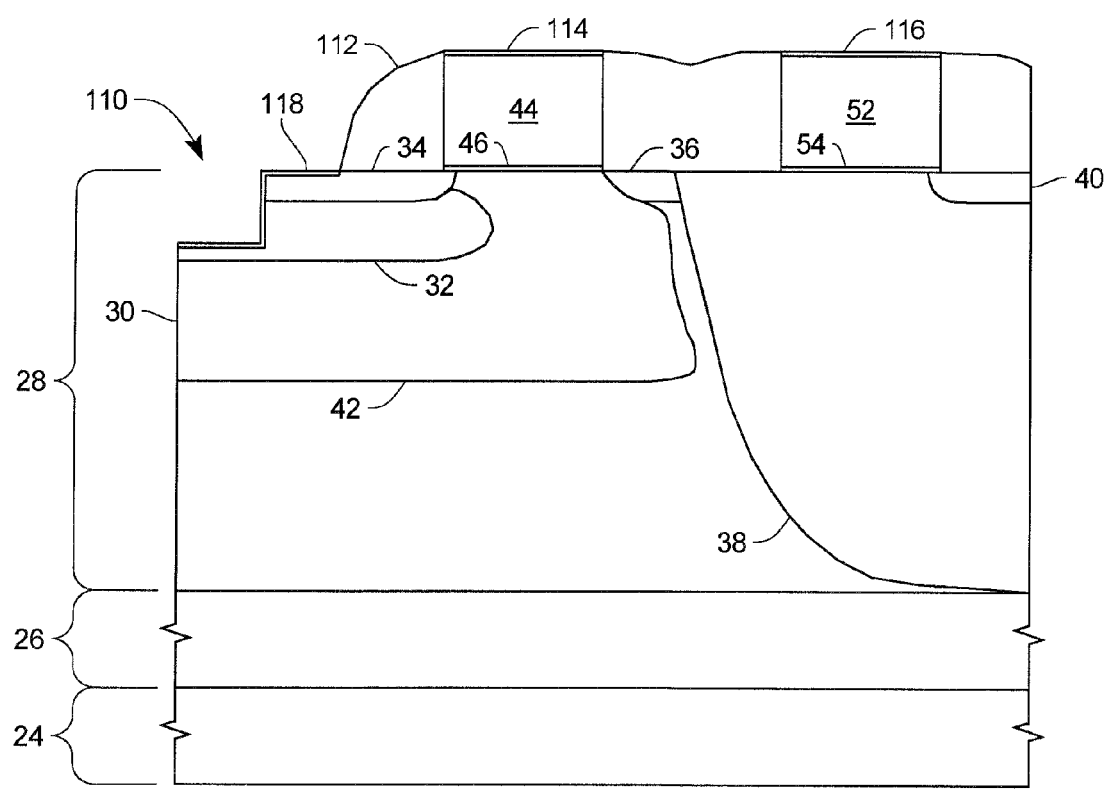

FIG. 2F shows a stage in the process of forming the lateral MOSFET 20 which may be used to form silicide on the gates 44, 52, on a side and a portion of the top surface of the source region 34, and on a side and a lateral surface of the heavy P body 32. An etched dimple 110 is formed on the left edge of the source region 34 and in an upper left portion of the heavy P body 32. The gate oxide 80 is stripped from the upper surface of the second epitaxial layer 28 except the portions 46, 54 under the gates 44, 52, respectively, and a dielectric 112, which may be borophosilicate glass (BPSG), is formed on the upper surface of the epitaxial layer 28 except in the dimple 110 and a portion on the top surface of source region 34 next to the dimple 110. The vertical height of the BPSG is the same as the height of the active gate 44 to allow formation of a silicide layer 114 on the top of the active gate 44 in one process embodiment. Alternatively, the silicides for the source region 34 and the heavy P body 32 may be formed in a process step separate from the process step used to form the silicide of the gate electrode 44. In the process stage shown in FIG. 2F, the non-active gate 52 is also silicided to form a top silicide layer 116. Another silicide layer 118 is formed in the cutout region 110 and the exposed top portion of the source region 34. The silicide layers may consist of Ti, Co, Pt, TiW, W, and other refractory metals or combinations thereof. The silicide layer 114 on the top of the active gate 44 results in faster switching of the lateral MOSFET 20 as is well known by those skilled in the art.

Figure 2G:
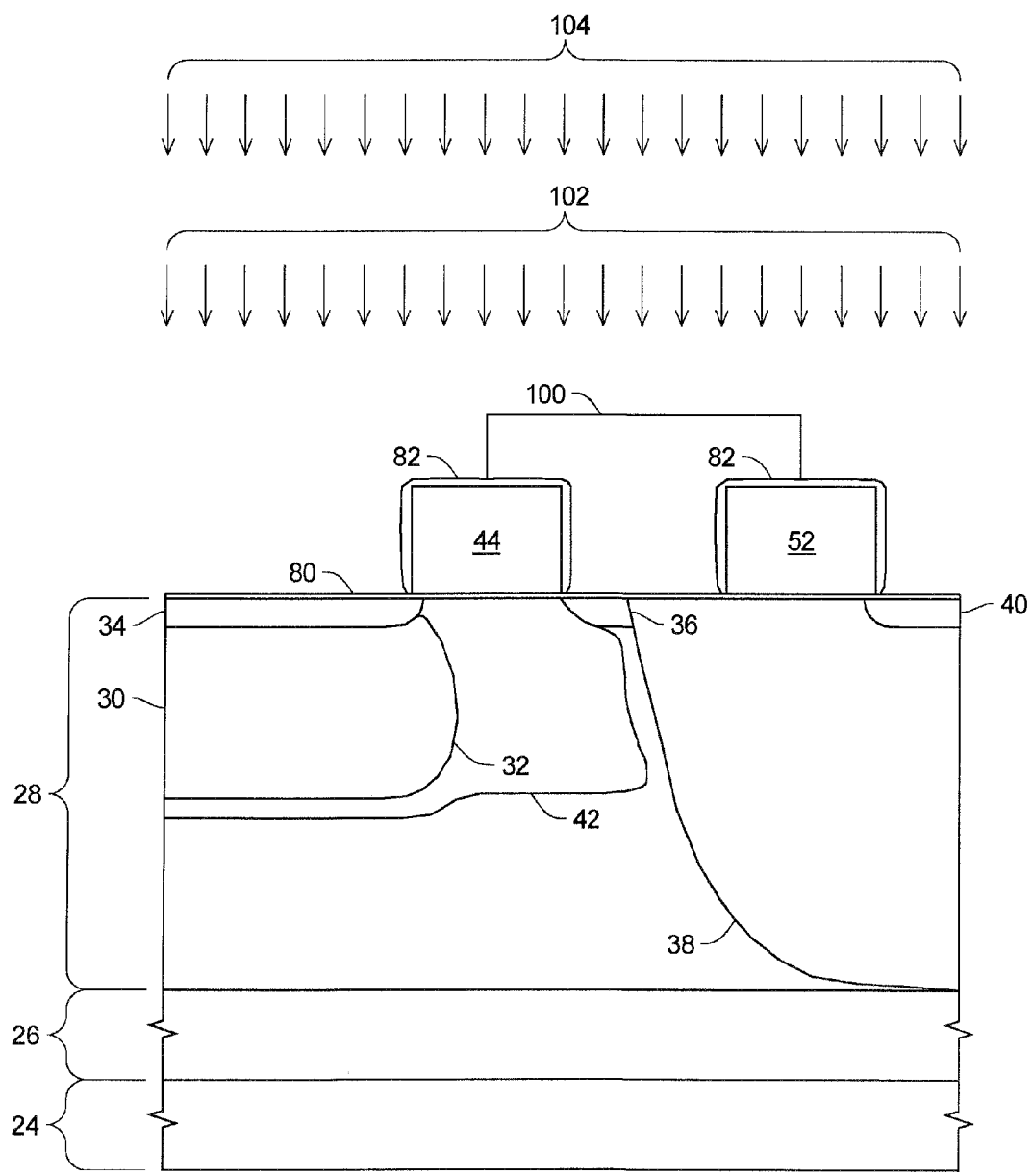

FIG. 2G shows the dielectric layer 58, such as a BPSG layer, formed on the upper surfaces of the second epitaxial layer 28, the silicides 114, 116, and on a right portion of the silicide 118 on the top surface of the source region 34. Metallization is then formed on the top and bottom of the structure shown in FIG. 2G to complete the lateral MOSFET 20 shown in FIG. 1A.

Chemical and mechanical polishing (CMP) can be used to provide planarity to improve photolithography capability and to facilitate forming salicides on the gate electrode 44.

Figure 2H:
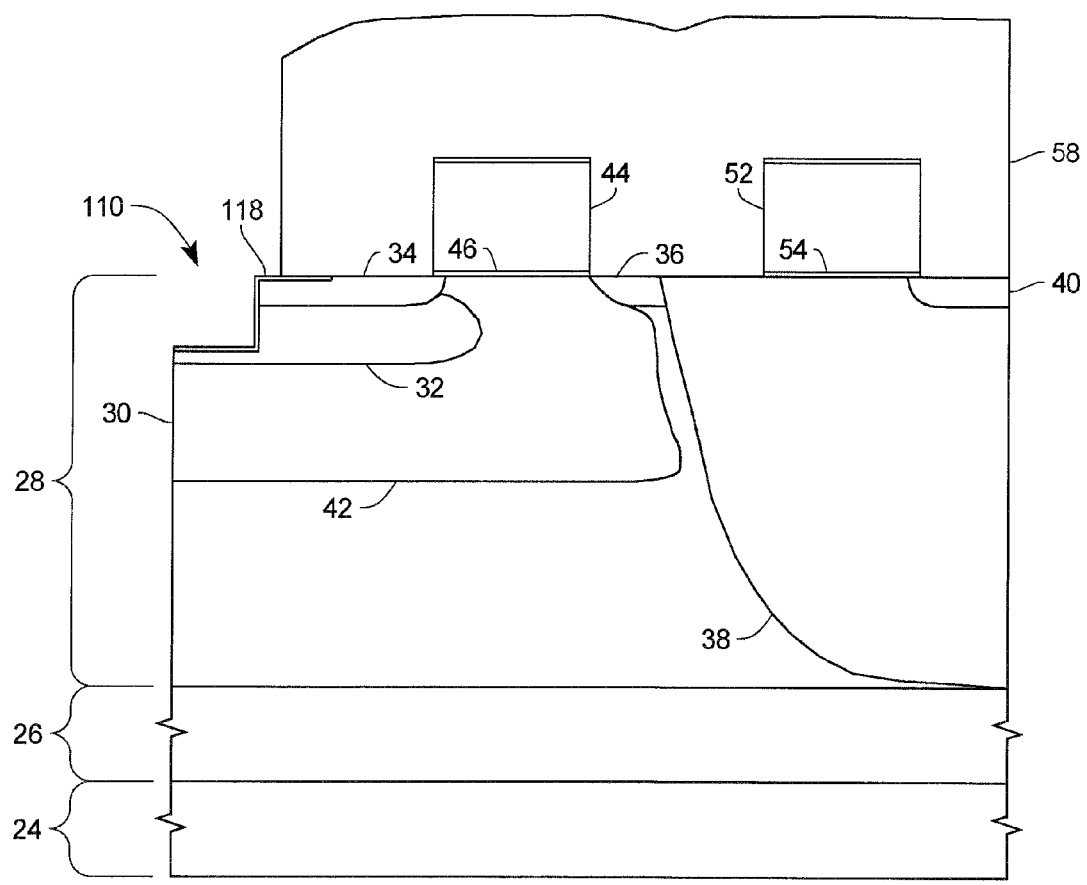
FIGS. 2H, 2I, and 2J show alternative embodiments of the heavy body shown in FIG. 1 at the process stage shown in FIG. 2E.
Figure 2I:
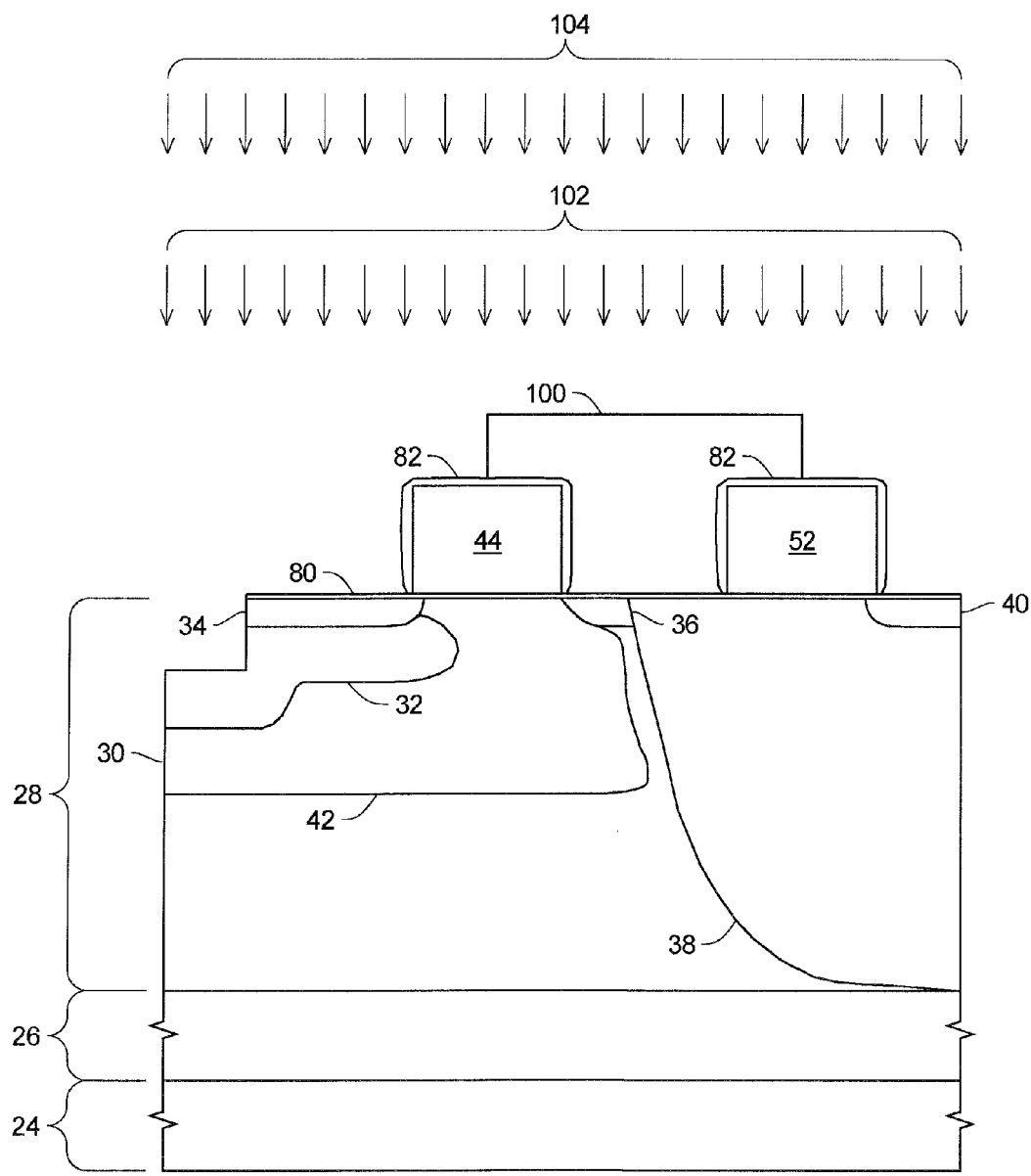
Figure 2J:
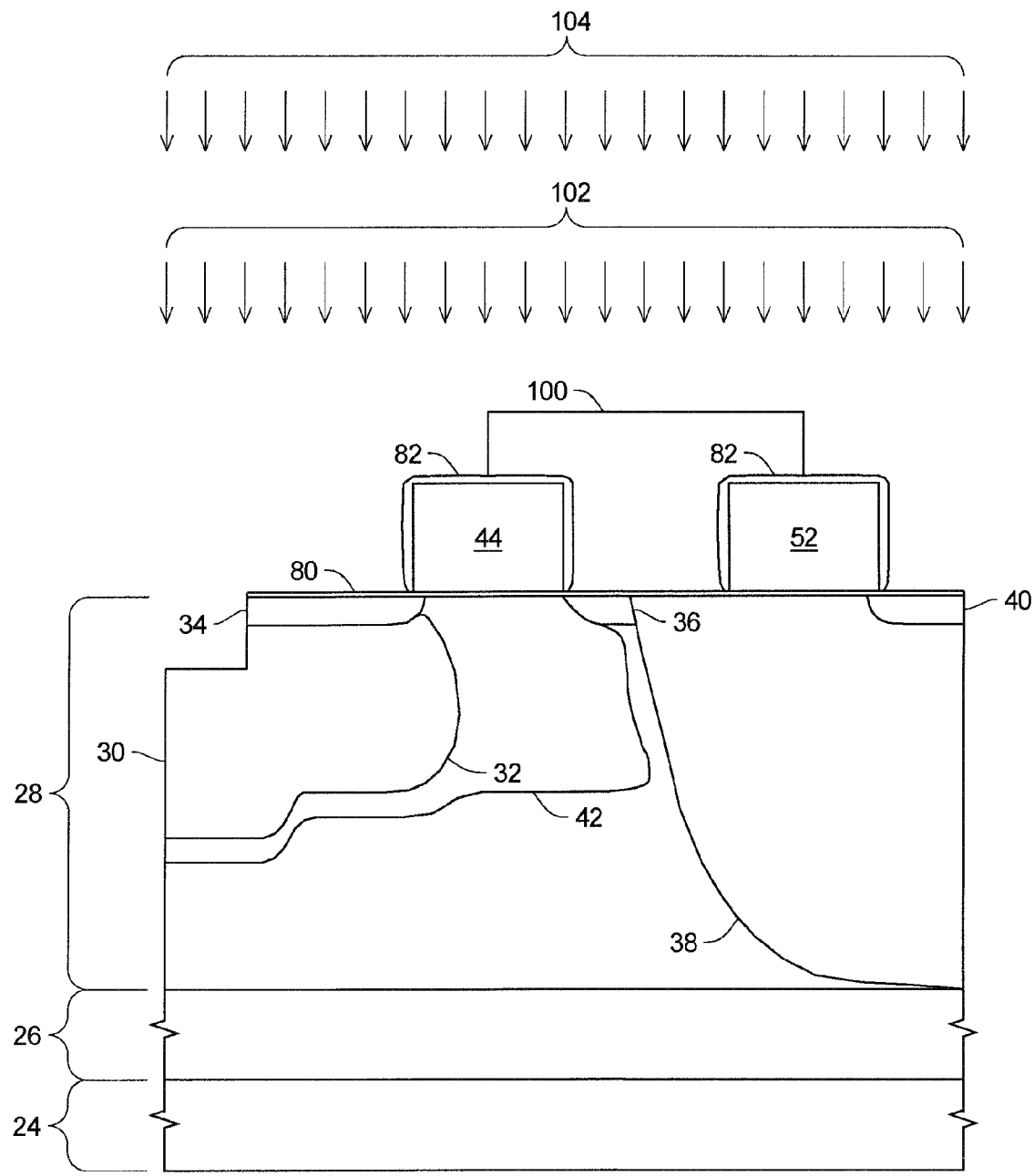

FIGS. 2H, 2I, and 2J show alternative embodiments of the heavy body shown in FIG. 1 at the process stage shown in FIG. 2E. In FIG. 2H the heavy P body 32 extends downward to slightly above or below the bottom edge of the PN junction 42 shown in FIG. 2E. FIG. 2I shows the shape of the heavy P body 32 of FIG. 2E when the dimple 110 is formed before the heavy P body 32 is formed, and FIG. 2J is FIG. 2I with the dimple 110 formed before the heavy P body is formed.

Figure 3A:
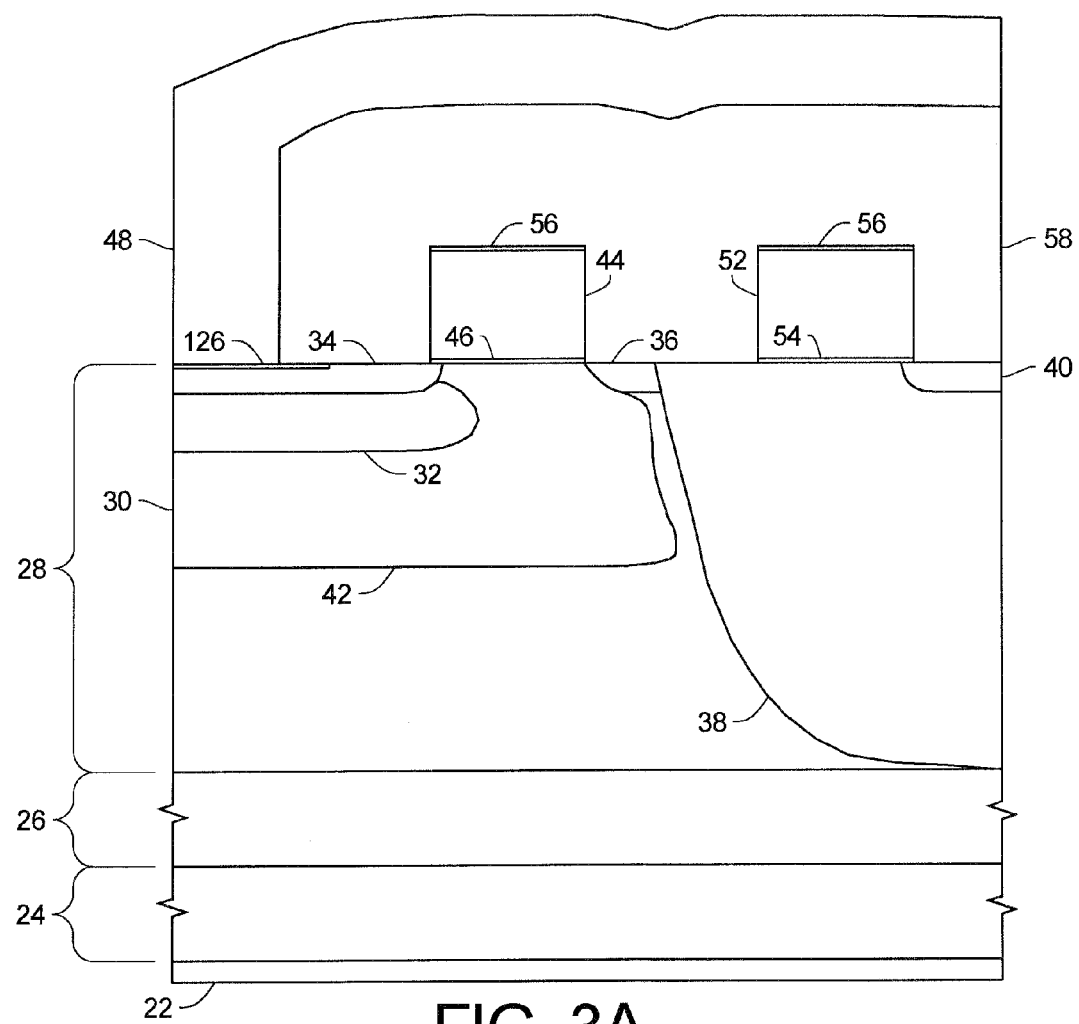
FIG. 3A is a side diagrammatical view of two other embodiments of a lateral MOSFET with a substrate drain connection according to the present invention.
Figure 3B:
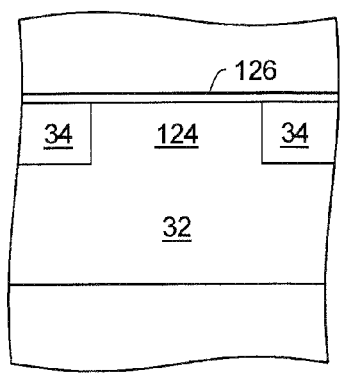
FIG. 3B is a partial diagrammatical end view of one of the embodiments of the lateral MOSFET shown in FIG. 3A.
Figure 3C:
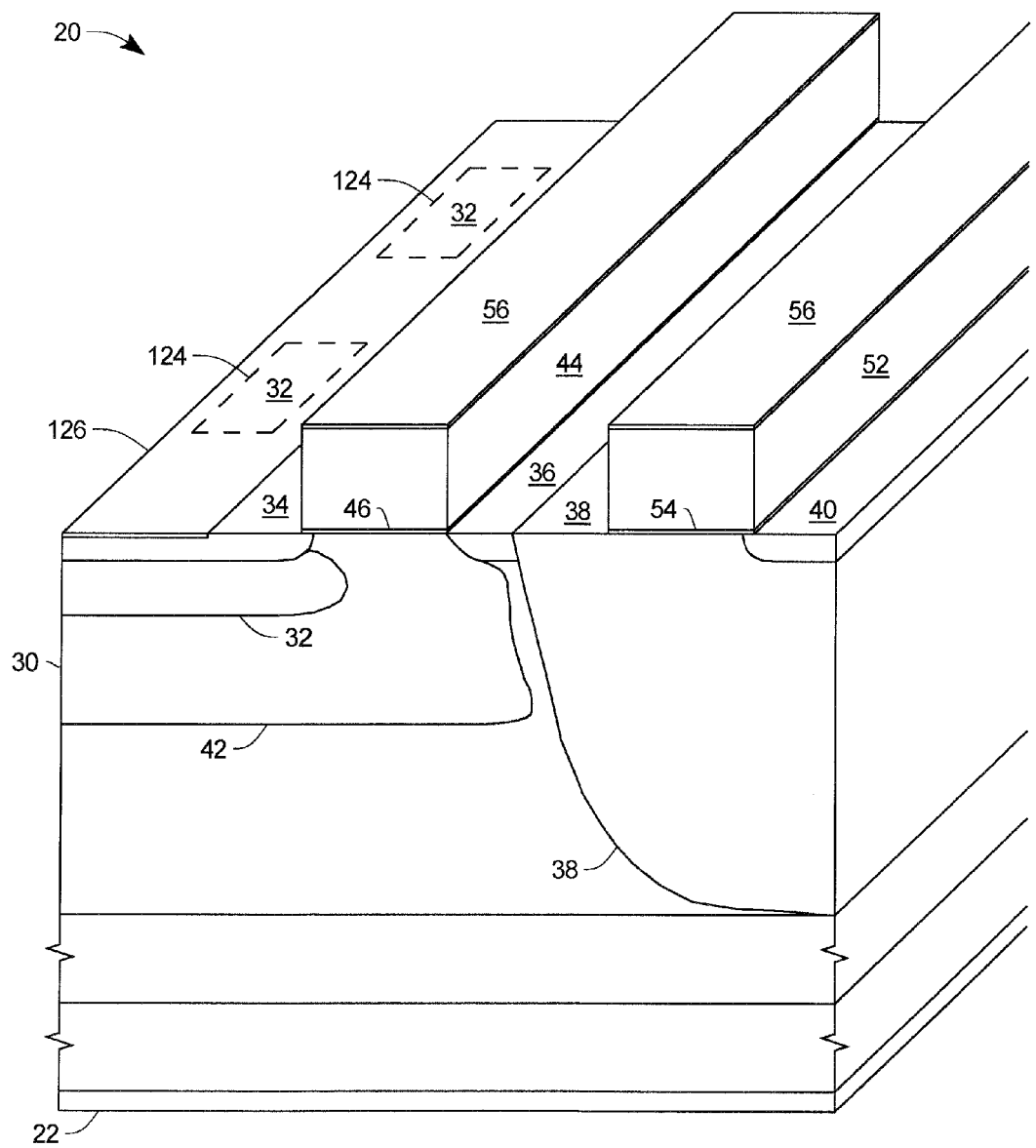
FIG. 3C is a perspective diagrammatical view of another of the embodiments of the lateral MOSFET shown in FIG. 3A.

FIGS. 3A 3B, and 3C show alternative methods of making contact to the heavy P body 32 by masking a portion of the source region 34 when it is formed so that a portion 124 of the heavy P body 32 lies at the top surface of the second epitaxial layer 28. The dimple 110 is not formed, and the metallization 48 lies on a silicide layer 126 which covers the top of portion 124 of the heavy P body 32 and the left top portion of source region 34. In FIG. 3C the metallization 48 and the dielectric layer 58 are not shown in order to avoid cluttering the drawing.

Figure 4:
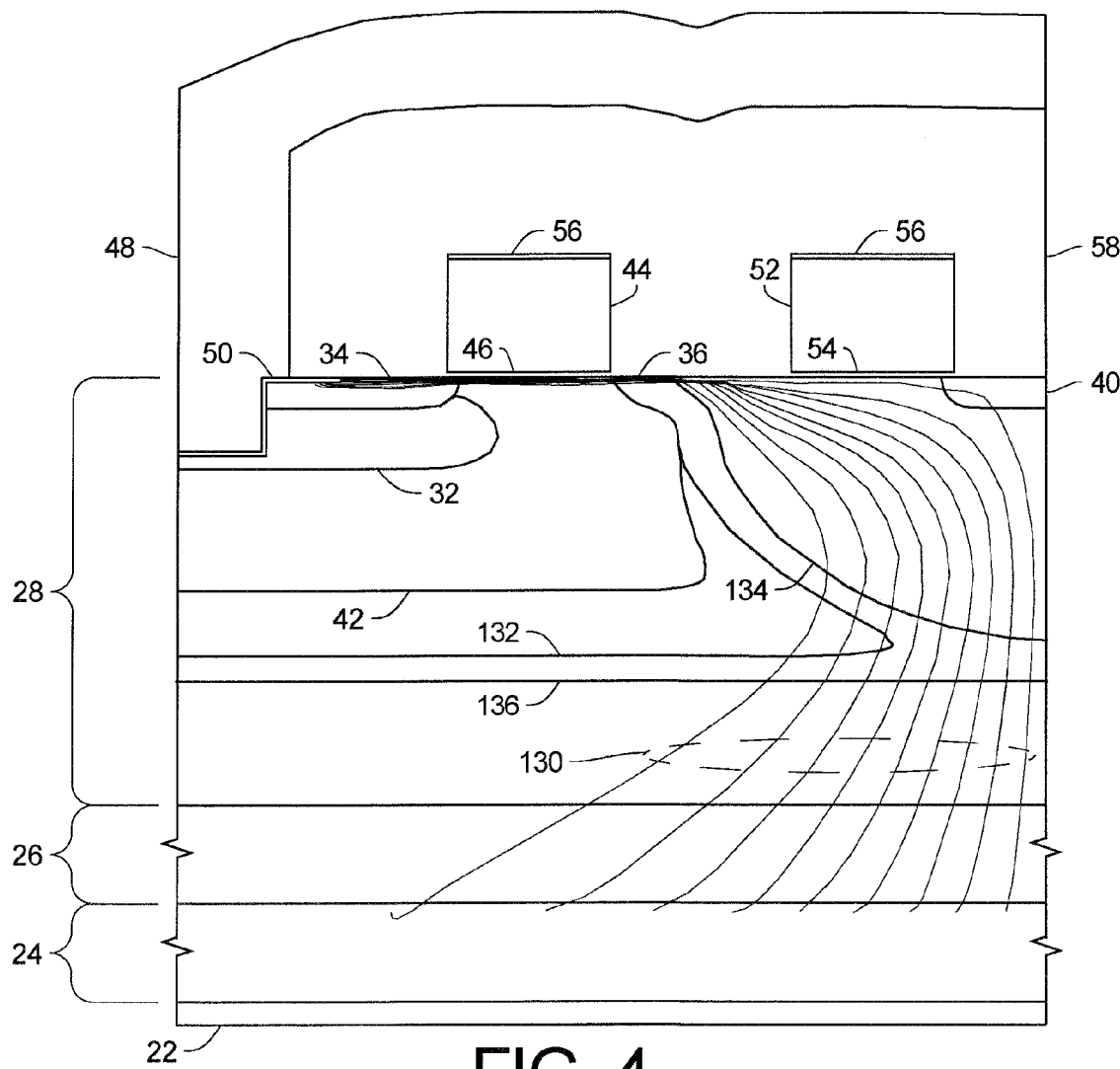
FIG. 4 is a side diagrammatical view of the lateral MOSFET shown in FIG. 1A showing selected simulated characteristics of the lateral MOSFET of FIG. 1A.

FIG. 4 is FIG. 1A showing simulated current paths 130 through the lateral MOSFET 20 together with simulated N-type dopant concentration contours 132, 134, and 136 shown in the second epitaxial layer 28 which shows two of several dopant contours which are not shown in FIG. 4 to avoid cluttering the figure. Contour lines 134 and 136 show the same dopant concentration which is a higher dopant concentration than the dopant concentration represented by the contour line 132. In one simulation, contour lines 134 and 136 represent an N-type dopant concentration of 1e18 cm$^{-3}$, and contour line 132 represents an N-type dopant concentration of 1e17.5 cm$^{-3}$.

In the simulation represented in FIG. 4, the vertical gradient is a simulation based on a single phosphorous implant at 5e15@160 KeV. As stated above, multiple implantations may provide a narrower and more uniform vertical dopant profile.

The current density is greatest along the top surface of the second epitaxial layer 28 in the source region 34, the channel portion of the P well 30, and the LDD region 36. Since the LDD region 36 is lightly doped compared to the source region 34, the LDD region 36 has a large effect on the Rdson of the lateral MOSFET 20. Also, since the LDD region 36 is the portion of the drain closest to the active gate 44, it has a large effect on the Qgd of the lateral MOSFET 20.

Figure 5:
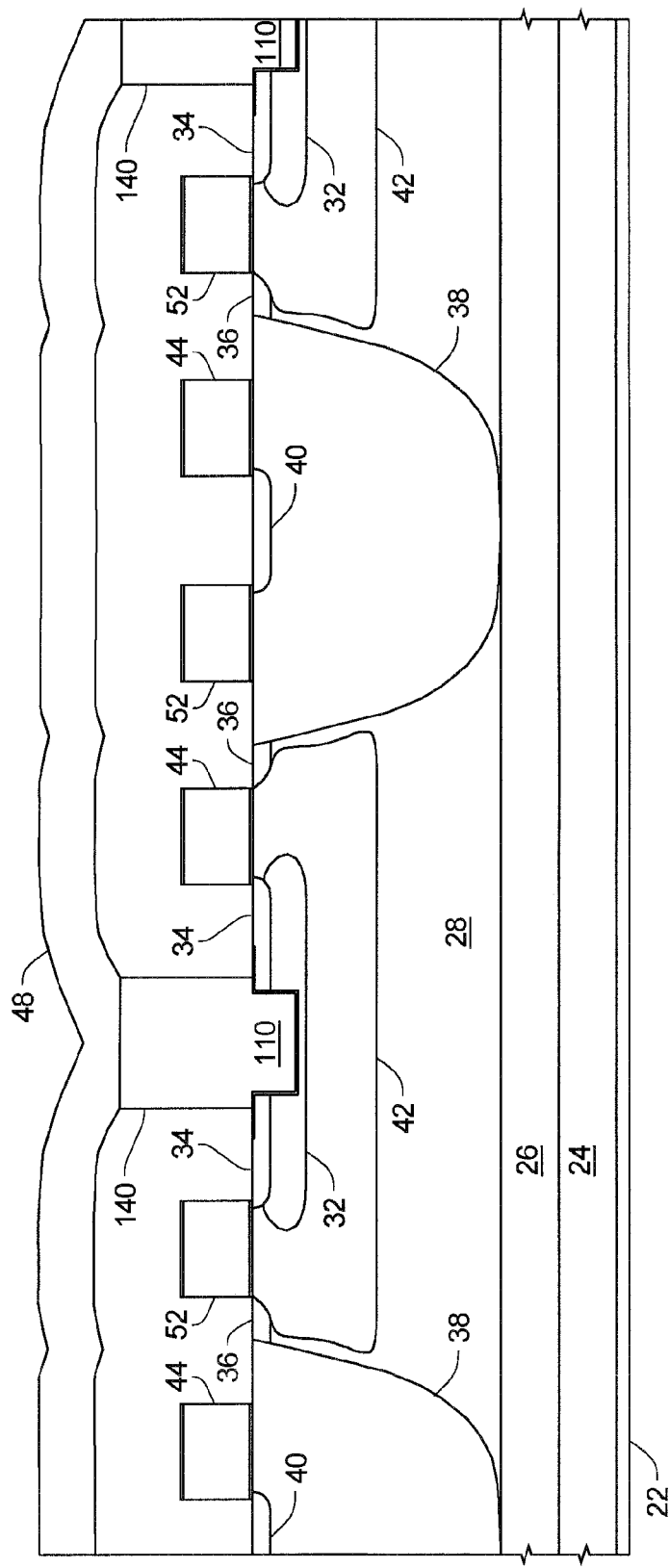
FIG. 5 is a side diagrammatical view of three of the lateral MOSFETs shown in FIG. 1A embodied on a common substrate.

FIG. 5 is a diagrammatical view of the physical relationship of three lateral MOSFETs 20 formed on a single substrate with metal plugs 140 that extend from the dimples 110 to the upper metal layer 48. The extension of the metallization 48 below the top surface of the second epitaxial layer 28 allows contact on side portions of the source region 34 and the heavy P body 32, thus allowing a shorter separation between adjacent source regions 34, and consequently a narrower width lateral MOSFET 20 than would generally be the case in which the metallization 48 did not extend along a side portion of the source region 34 and the heavy P body 32.

Figure 6A:
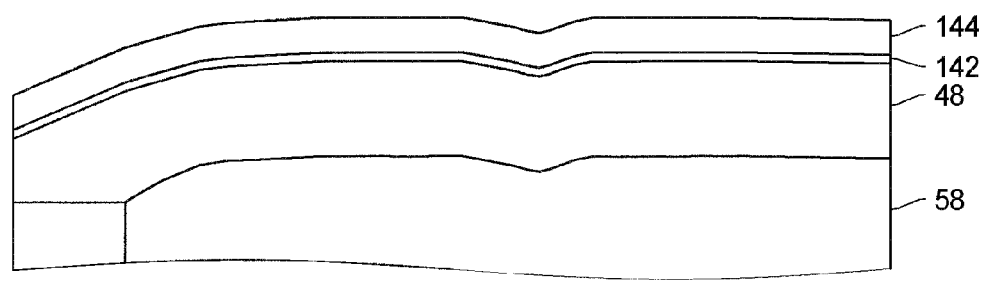
FIGS. 6A and 6B show alternative embodiments of the metallization shown in FIG. 1.
Figure 6B:
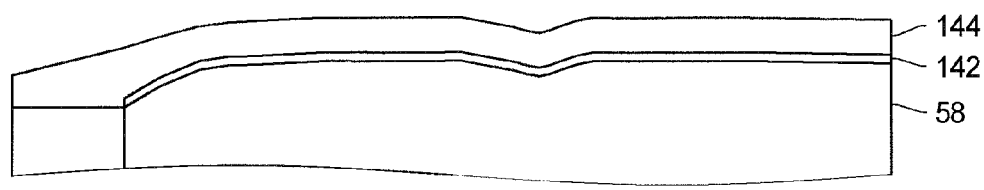

FIGS. 6A and 6B show alternative embodiments of the metallization 48 shown in FIG. 1. In FIG. 6A the aluminum top metallization 48 is covered by a barrier layer 142 with another metal layer 144, such as copper or other solderable metal such as silver, on top of the barrier layer 142 which has a lower resistivity than aluminum. The barrier layer 142 may be Ta, TaN, Ti, TiN or other barrier metals known in the industry. In FIG. 6B the barrier layer 142 and the low resistivity metal layer 144 replace the top aluminum layer 48 shown in FIG. 1A such that the barrier layer 142 is in direct contact with the silicide layer 50 and the dielectric layer 58.

Figure 8:
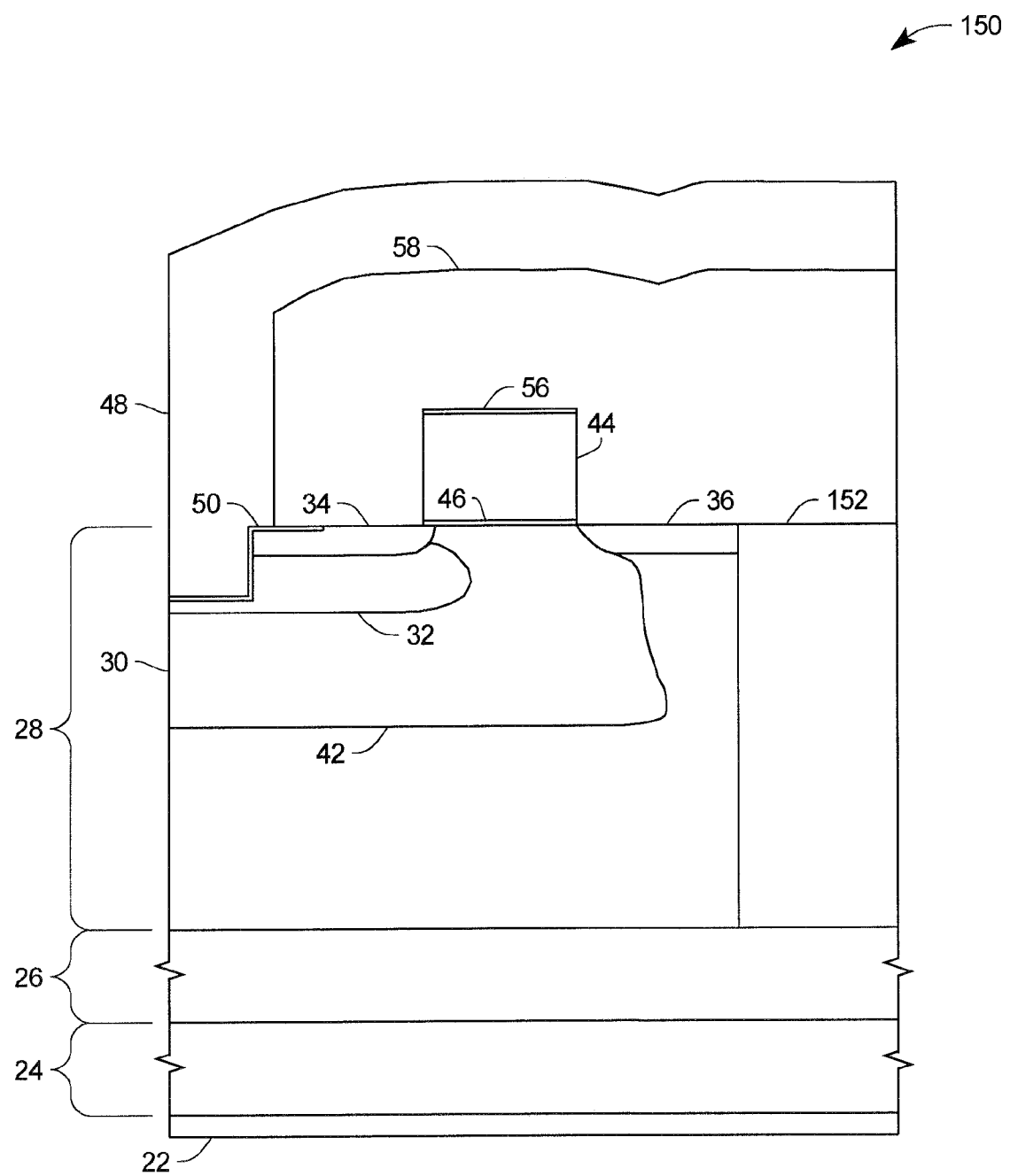
FIG. 8 is another embodiment of a lateral MOSFET with a substrate drain connection according to the present invention.

FIG. 8 is another embodiment of a lateral MOSFET 150 with a substrate drain connection according to the present invention. Instead of the sinker 38 in the lateral MOSFET 20, the lateral MOSFET 150 has a trench 152 filled with a conductive material, such as polysilicon, which can be deposited without a dopant and later doped by ion implantation, or filled with a metal such as Ti, TiW, Co, Ta, TaN, Alum, Cu, etc., or a combination of such metal.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention. For example, the lateral MOSFETs of the present invention can be formed as silicon-on-nothing MOSFETs.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A lateral MOSFET comprising:
    a heavily doped substrate of a first conductivity type;
    a first epitaxial layer of said first conductivity type laying over said substrate;
        a second epitaxial layer of said first conductivity type between said substrate and said first epitaxial layer;
    a diffused tub of a second conductivity type opposite to said first conductivity type formed in said second epitaxial layer;
    an active gate electrode on a gate dielectric which is on a major surface of said second epitaxial layer;
    a source region of said first conductivity type in said first epitaxial layer extending to said major surface of said second epitaxial layer and self aligned with a first edge of said active gate electrode;

a lightly doped drain of said first conductivity type in said second epitaxial layer extending to said major surface of said second epitaxial layer and self aligned with a second edge of said active gate electrode on an opposite side of said active gate electrode from said first edge;

a sinker region of said first conductivity type on the same side of said active gate electrode as said lightly dope drain and spaced apart from said active gate electrode, said sinker region extending from said major surface of said second epitaxial layer to a depth substantially equal to the depth of said first and second epitaxial layers;

a non-active gate electrode attached to said major surface of said second epitaxial layer for defining the lateral edge of the sinker region between the major surface of the second epitaxial layer and the first epitaxial layer and the lateral edge of the lightly doped drain region, said non-active gate electrode on the same side of said active gate electrode as said lightly dope diffusion and spaced apart from said active gate electrode, and substantially between said lightly doped diffusion and said portion of said sinker in said major surface of said second epitaxial layer.

2. The lateral MOSFET of claim 1 wherein said diffused tub has a dopant profile of a diffused region such that the dopant profile of the diffused tub decreases from the major surface of the first epitaxial layer downward.

3. The lateral MOSFET of claim 1 wherein said diffused tub has a dopant profile of a region formed by multiple implants such that the vertical dopant profile of the diffused tub is substantially uniform.

4. The lateral MOSFET of claim 1 further including a heavily doped region of said second conductivity type laying substantially below said source region.

5. The lateral MOSFET of claim 1 wherein said sinker has a vertical dopant profile which decreases from the major surface of the first epitaxial layer downward.

6. The lateral MOSFET of claim 1 wherein said sinker has a vertical dopant profile which is substantially uniform.

7. The lateral MOSFET of claim 1 wherein said sinker has a vertical dopant profile which increases from the major surface of the first epitaxial layer downward.

8. A lateral MOSFET comprising:

an active gate positioned laterally between a source region and a drain region, said drain region extending from an upper surface of a monocrystalline semiconductor body to a bottom surface of said monocrystalline semiconductor body;

a lightly doped drain region having opposite lateral edges, one lateral edge defined by the active gate;

a sinker diffusion extending from the upper surface to the lower surface of the monocrystalline semiconductor body;

a non-active gate on a gate dielectric which is on a major surface of said lateral MOSFET and above said drain region, said non-active gate defining the other lateral edge of a lightly doped drain region and a vertical edge of the sinker diffusion disposed below the non-active gate.

9. The lateral MOSFET of claim 8 wherein a channel region of a first conductivity type lies below said active gate in an epitaxial layer of a second conductivity type opposite to said first conductivity type.

10. The lateral MOSFET of claim 8 wherein said monocrystalline semiconductor body comprises a substrate with a first epitaxial layer on said substrate, and a second epitaxial layer on said first epitaxial layer.

11. The lateral MOSFET of claim 10 wherein said substrate, said first epitaxial layer, and said second epitaxial layer are of the same conductivity type.

12. The lateral MOSFET of claim 8 wherein said active gate and said non-active gate are of substantially the same height.

13. The lateral MOSFET of claim 8 wherein the width of said non-active gate is greater than a mask alignment tolerance when said lateral MOSFET is fabricated.

14. The lateral MOSFET of claim 8 wherein the width of said non-active gate is equal to a mask alignment tolerance when said lateral MOSFET is fabricated.

15. The lateral MOSFET of claim 9 wherein said channel region is part of a larger region of the same conductivity type, and said larger region has a vertical doping gradient which is not substantially uniform.

16. The lateral MOSFET of claim 9 wherein said channel region is part of a larger region of the same conductivity type, and said larger region has a vertical doping gradient which is substantially uniform.

17. The lateral MOSFET of claim 8 wherein said drain region has a substantially uniform vertical dopant concentration.

18. The lateral MOSFET of claim 8 wherein an upper portion of said drain region has a higher dopant concentration than a portion of said drain region lying below said upper portion.

19. The lateral MOSFET of claim 8 wherein an upper portion of said drain region has a lower dopant concentration than a portion of said drain region lying below said upper portion.

20. The lateral MOSFET of claim 18 wherein said upper portion has a vertical dopant concentration that is substantially uniform.

21. The lateral MOSFET of claim 20 wherein a width of said upper portion decreases along a line extending downward from a top of said upper portion to a bottom of said upper portion.

* * * * *